United States Patent [19]

Dyck

[11] Patent Number: 4,918,506
[45] Date of Patent: Apr. 17, 1990

[54] SELECTABLE RESOLUTION LINE-SCAN IMAGE SENSOR

[75] Inventor: Rudolph H. Dyck, Palo Alto, Calif.

[73] Assignee: Fairchild Camera & Instrument Corporation, Mountain View, Calif.

[21] Appl. No.: 775,668

[22] Filed: Sep. 13, 1985

[51] Int. Cl.$^4$ .................... H01L 29/78; H01L 27/14; H01L 31/00; G11C 19/28

[52] U.S. Cl. ........................................ 357/24; 357/30; 250/578.1; 377/60; 307/311

[58] Field of Search ................ 357/24, 30; 377/57-63; 307/311; 250/578

[56] References Cited

U.S. PATENT DOCUMENTS

| | | | |
|---|---|---|---|
| 4,281,254 | 7/1981 | Seachman | 250/578 |
| 4,495,422 | 1/1985 | Wiggins | 250/578 |
| 4,539,597 | 9/1985 | Kinoshita et al. | 357/24 |
| 4,540,901 | 9/1985 | Suzuki | 357/24 |

*Primary Examiner*—Gene M. Munson
*Attorney, Agent, or Firm*—Burns, Doane, Swecker & Mathis

[57] ABSTRACT

A line scan image sensor capable of operating at several different spatial sampling frequencies is provided by utilizing a line scanning array having sampling photoelements of different surface areas. The spatial sampling frequency of the sensor can be varied by selectively combining the charge packets generated by the individual photoelements. In a preferred embodiment, photoelements having two different surface areas are used, with the ratio of the smaller surface area with respect to the larger surface area being 1:$\sqrt{2}$. A programmable amplifier is provided to normalize the outputs of photoelements having different surface areas so that a uniform illumination on different photoelements will produce a uniform response. The programmable amplifier can also be programmed to equalize the outputs of the sensor between the different spatial sampling frequency modes.

24 Claims, 3 Drawing Sheets

SELECTABLE RESOLUTION LINE-SCAN IMAGE SENSOR

BACKGROUND OF THE INVENTION

The present invention relates to line scan image sensors and, more particularly, to a solid state line scan image sensor having a variable resolution.

Line scan image sensors such as solid state photosensors using charge coupled device (CCD) transfer are used to scan an image and produce data in the form of successive charge packets representing a linear portion of the image. Such sensors are frequently used to scan successive lines of an image in scanning applications such as facsimile or optical character recognition.

A typical CCD line scan image sensor has a row of photoelements for sensing the light intensity of a predetermined number of samples or picture elements (pixels) of an image. The number of pixels per unit length on the page is a measure of the resolution of the device and determines the number of photoelements necessary to scan the full width of the page to be imaged. A device having 200 pixel per inch resolution, for example, requires 1700 photoelements to scan one line of an 8½ inch wide page, while a device having 400 pixel per inch resolution requires twice as many photoelements to scan the same page width. Similarly, the resolution of the line scan image sensor determines the amount of data (number of charge packets) per line of the image and the time required to scan a line for a fixed data rate.

Systems requiring a high degree of resolution tend to be slow, whereas high speed readers often lack the degree of resolution required in certain applications. Accordingly, it is desirable to provide a sensor which is operable at several discrete spatial sampling frequencies in order to permit a selectable transmission rate. The typical prior art approach is to group the charge packets produced by the individual photoelements by combining them either on the image sensor chip or in an off-chip resampling circuit. Thus, for example, a 2:1 reduction in resolution may be achieved by grouping pairs of adjacent charge packets to decrease the data transmission time by one half for a fixed sample rate.

Charge packet grouping or combining in a CCD has been used successfully to achieve 2:1 and 3:1 reductions in resolution and spatial sampling frequency. However, one of the reductions of interest, a 4:3 reduction, has not been achieved using conventional grouping techniques. To my knowledge, attempts at achieving this desired reduction ratio using off-chip resampling techniques have also not been successful thus far.

Theoretically, it is possible to provide a line scan image sensor having a resolution of 1200 pixels per inch, and to operate it in a 400 pixel per inch mode by combining charge packets into groups of three, or to operate it in a 300 pixel per inch mode by combining charge packets into groups of four. This scheme, however, requires a very high resolution line scan sensor which would be both expensive and complex.

OBJECTS AND BRIEF SUMMARY OF THE INVENTION

Accordingly, it is an object of the present invention to provide a novel method and system for achieving a variable resolution in a line scan image sensor wherein the variation in resolution can be other than an integral reduction of the maximum resolution.

It is another object of the present invention to provide a novel line scan image sensor in which the resolution of the sensor can be varied to achieve both integral and non-integral reductions in resolution by charge packet grouping techniques, and in particular a 4:3 reduction in sensor resolution without the necessity of providing an extremely high-resolution line scan image sensor by grouping of charge packets of different sized photoelements.

It is yet another object of the present invention to provide a novel gain programmable amplifier for sensing charge packets and amplifying the charge packets by desired, programmable charge-to-voltage conversion factors in order to equalize the output signals of different sized photoelements for equal illuminations.

In accordance with the present invention, a variable resolution line scan image sensor comprises a series of sensing elements of different sizes, e.g. different surface areas. In operation, the elements produce charge packets which can be combined in several different manners to produce different degrees of resolution.

More specifically, image sensing elements of two different sizes are linearly arranged such that they produce one image sensor resolution when they are individually sampled. The size difference between the sensing elements is such that the charge packets, when grouped in a predetermined manner, produce a non-integral reduction in resolution, e.g., a 4:3 reduction rather than an integral 2:1 or 3:1 reduction. The ratio of the size of the photoelements is related to the desired non-integral reduction in resolution. For a 4:3 resolution reduction, the size ratio is ideally $1:\sqrt{2}$.

In order to produce a uniform output signal along the entire image sensor for a uniform illumination, a programmable amplifier is set to amplify the individual and grouped charge packets in accordance with an associated charge-to-voltage conversion factor. In accordance with the preferred embodiment, the amplifier can be programmed for different conversion factors and can be integrated into the line scan image sensor chip.

BRIEF DESCRIPTION OF THE DRAWINGS

The foregoing and other objects and advantages of the present invention will become apparent to one skilled in the art from the following detailed description when read in conjunction with the appended drawings in which.

DESCRIPTION OF THE PREFERRED EMBODIMENT

Figure 1A:
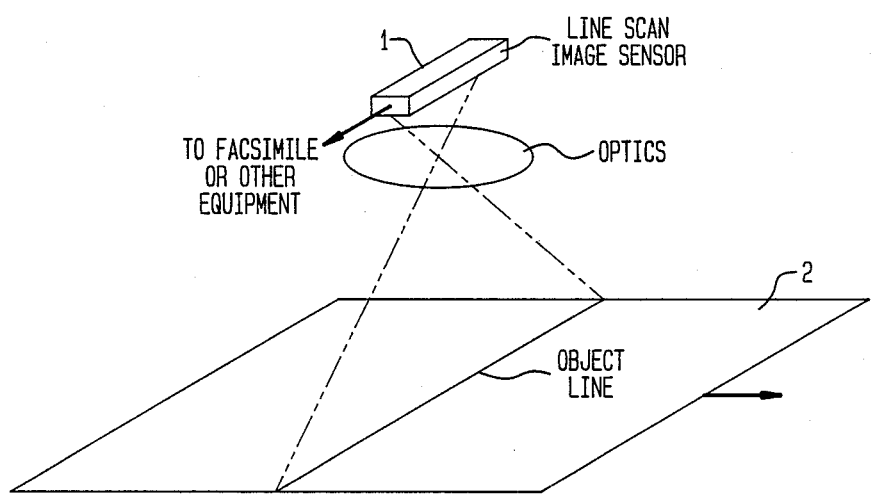
FIG. 1A is a functional block diagram illustrating a known image scanning arrangement for facsimile or optical character recognition applications.
Figure 1B:
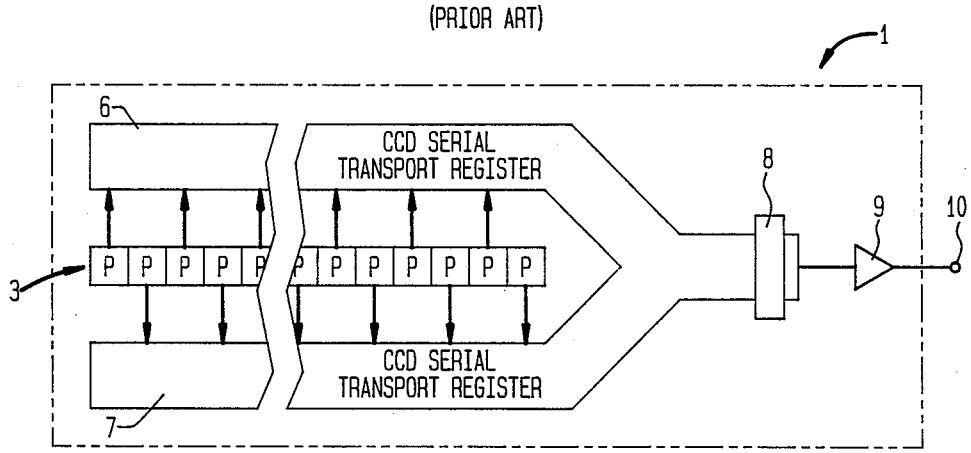
FIG. 1B is a functional block diagram of a conventional CCD line scan image sensor.

To assist in an understanding of the present invention, a conventional application of line scan image sensors as well as a conventional CCD line scan image sensor are illustrated in FIGS. 1A and 1B. The present invention is described as being used with a facsimile device. This is merely illustrative and it will be readily appreciated that the invention may be used in any line scan image sensor.

Referring to FIG. 1A, a conventional line scan imaging system includes a line scan image sensor 1 which receives a focused line image and produces an output signal for use in a facsimile device or the like. The document 2 is illuminated by a light source (not illustrated) which may be arranged either above or below the document 2. The illuminated document 2 is transported in the direction of the arrow at a rate corresponding to the scanning speed of the line scan image sensor 1. An image of a single line of the document 2 is focussed by the optics onto the line scan image sensor 1, which generates a serial signal to the facsimile device.

As shown in FIG. 1B, the image sensor 1 comprises a linear array 3 of photoelements and a pair of CCD serial transport registers 6 and 7. The scanned line image is projected onto the array 3 and the individual photoelements generate charges proportional to the intensity of light impinging on the respective photoelements.

The charges from the photoelements create charge packets which are periodically transferred into the CCD transport registers 6 and 7, respectively. These charge packets are serially shifted along the CCD registers 6 and 7 and are interleaved at a pairing enable gate 8. The charge packet signals are amplified by an amplifier 9 as they are shifted out of the CCD registers 6 and 7.

The signals at the amplifier output terminal 10 are serially input into a comparator which compares the signal at output terminal 10 to a threshold level signal in order to determine whether the signals generated by the individual sampling photoelements in the array 3 are to be classified as representative of black picture elements or white picture elements. A signal on the output 10 which is greater than the threshold level corresponds to a white picture element, whereas a signal on output 10 which is less than the threshold level corresponds to a black picture element. The comparator may be placed on the same substrate as the linear array 3, in which case the output of the line scan image sensor 1 would be a series of signals each indicating a black or white pixel.

As mentioned earlier, in a conventional line scan image sensor the number of photoelements in the linear array 3 is determined by the desired linear resolution of the image sensor and the line length of the image to be scanned. Thus, the resolution of the device is fixed at the time of manufacture depending upon the number of photoelements placed on the sensor.

Figure 2:
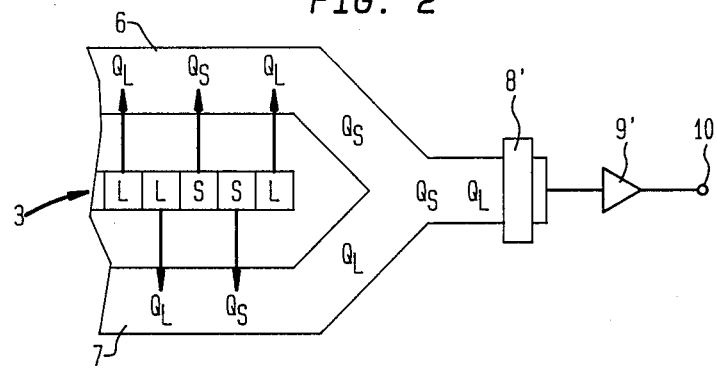
FIG. 2 is a functional block diagram illustrating one embodiment of a line scan image sensor according to the present invention.

However, the present invention achieves a variable resolution capability by providing the sensor with a plurality of photoelements having different size fields of view or apertures. Referring to FIGS. 2 and 3, the linear array 3 is provided with alternately arranged pairs of large photoelements L and small photoelements S, with a single large photoelement L being arranged at each end of the linear array 3. Preferably, the ratio of the width of the small photoelement S relative to the width of the large photoelement element L is $1:\sqrt{2}$.

The photoelements generate corresponding transfer charge packets $Q_L$ or $Q_S$ that are received at the CCD transport registers 6 and 7. These charge packets are shifted along the CCD registers 6 and 7, and interleaved at the gate 8, as in a conventional line scan image sensor, in order to produce a series of charge packets which provide an indication of the amount of light impinging upon the corresponding alternately arranged pairs of large photoelements L and small photoelements S. By selectively combining the charge packets, the line scan image sensor can operate at one of several different spatial sampling frequencies, such as 200, 300 or 400 pixels per inch.

An example of the operation of the device at a spatial sampling frequency of 400 pixels per inch will be described first. In order to operate at the highest spatial sampling frequency, the charge packet generated by each of the photoelements in the linear array 3 are processed individually so that each photoelement produces a signal which is compared against a threshold value to make a black/white decision.

Due to the smaller surface area of the small photoelements S relative to the large photoelements L, a uniform illumination on photoelements of the two sizes will not produce a uniform output signal. In order to compensate for the smaller charge generated by the small photoelements S, the amplifier 9' has a programmable charge-to-voltage conversion factor. Signals from the large photoelements L will be amplified by a charge-to-voltage conversion factor $G_1$ and signals from the small photoelements S will be amplified by a conversion factor $G_1\sqrt{2}$, thus producing a uniform output signal for uniform illumination on the photoelements.

Each voltage signal output by the switchable-gain amplifier 9' is then compared against a threshold value, and a determination is made as to whether the signals generated by the individual photoelements correspond to black or white pixels.

When set to operate at a spatial sampling frequency of 300 pixels per inch, the charge packets from adjacent small photoelements S are combined at the pairing enable gate 8' before being sensed by the amplifier 9', whereas the large photoelements L are processed individually. By combining the charge packets of the small photoelements S in this manner, the number of samples, and thus the data frequency, is reduced by 25% to 300 samples per inch.

The effective width of the area sampled by the combined charge packets from the small photoelements S is 2w, whereas the width of the area sampled by the large photoelements L remains as $w\sqrt{2}$. Thus, the programmable-gain amplifier 9' must now provide a conversion factor $G_2$ for the combined small charge packets and a conversion factor $G_2\sqrt{2}$ for the charge packets from the large photoelements L in order to produce a uniform output signal in response to a uniform illumination. This is necessary because the effective width of the combined small photoelements S is $\sqrt{2}$ times the width of the large photoelements L.

Sampling at a spatial frequency of 200 pixels per inch is easily achieved by combining the charge packets from adjacent small and large photoelements at the pairing enable gate 8'. By pairing the photoelements in this manner, a 50% reduction in resolution from the 400 pixel per inch spatial frequency is obtained. Since each of the photoelement pairs has the same surface area, there is no requirement that the programmable amplifier 9' provide different conversion factors for various charge packets leaving the pairing enable gate 8'. Each charge packet leaving the pairing enable gate 8' is therefore multiplied by a uniform conversion factor $G_3$.

Preferably, a uniform illumination will generate a uniform output for each reading sample, independent of the spatial frequency. In order to achieve this it is necessary to normalize the outputs between modes. Thus, it is desirable to have the various conversion factors produced by the programmable amplifier 9' related to each other in a manner effective to normalize between modes.

Since the large photoelements L in both the 300 and 400 spatial frequency modes should generate the same amplitude signal for a uniform illumination, it is readily apparent that $G_1 = \sqrt{2}\, G_2$. The gains $G_1$ and $G_3$ can be calculated relative to each other by equating the amplified signal produced by a large photoelement in the 400 pixel/inch mode with a combined pixel in the 200 pixel/inch mode. If the large photoelement L produces a charge $Q_L$ in response to a given incident light intensity, the combined large and small photoelements will produce a combined charge equal to $\frac{1}{2}(1+\sqrt{2})Q_L$ due to the larger surface area. Thus, $G_1 Q_L = \frac{1}{2} G_3(1+\sqrt{2})Q_L$ and, cancelling $Q_L$, $\frac{1}{2} G_1 = G_3(\sqrt{2})$. By setting the programmable amplifier to operate at these related discrete levels, the outputs between modes can be normalized.

Instead of normalizing between modes in this manner, it would also be possible to vary the level of the threshold signal against which the sensor output signals are compared. The threshold value used in the 200 pixel/inch mode would be higher than the threshold value used in the 300 pixel/inch mode which, in turn, would be higher than the threshold value used in the 400 pixel/inch mode.

Figure 3A:
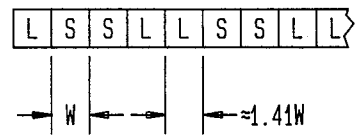
FIGS. 3A, 3B, 3C and 3D are a diagrams illustrating the principles of operation of the line scan image sensor of FIG. 2.
Figure 3B:
Figure 3C:
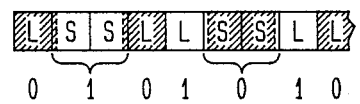
Figure 3D:
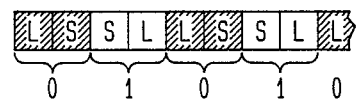

Referring now to FIG. 3, a Nyquist bar pattern corresponding to a spatial sampling frequency of 400 pixels per inch is indicated by the hatched-line pattern in FIG. 3b. Ideally, a line scan image sensor having a 400 pixel per inch resolution will generate an alternating series of black and white signals (indicated by 0's and 1's, respectively) in response to this bar pattern. As apparent in the drawing, a single bar covering a small photoelement S overlaps onto an adjacent large photoelement L due to the non-uniform center-to-center spacing of the sampling photoelements. A Nyquist bar pattern for a 300 pixels per inch sampling frequency is indicated by the hatched-line pattern in FIG. 3c. As indicated by the Nyquist bar pattern of FIG. 3d, there is no overlap when sampling at 200 pixels per inch since the width of each photoelement pair is roughly 1/200th of an inch. In general, these overlaps in the 300 and 400 pixel per inch modes affect the sampling accuracy of the image sensor only slightly, and do not provide a significant problem in actual practice.

Sampling errors are fundamentally inherent with any system that could produce a non-integral reduction in resolution. However, the present invention shares the error between the higher resolution mode and a lower resolution mode in order to avoid appreciable degradation of the sampling accuracy in any one mode.

Turning now to the operation of the programmable amplifier, a gated charge integrator is provided with a gate controlled channel region. By properly controlling the operation of the gate over the channel region, adjacent charge packets being transported on the CCD register can be merged together to form a combined charge packet. The gate control signal is generated in accordance with the mode in which the sensor is operating. In other words, in the 400 pixel per inch mode, every single charge packet arriving at the pairing enable gate 8' is individually gated into the amplifier 9'. In the 300 pixel per inch mode, a charge packet from the first of two adjacent small photoelements S is not gated through the pairing enable gate 8' until the next charge packet is shifted to the gate 8'. The combined charge packet is then supplied to the amplifier 9'. The pairing enable gate 8' works in the same manner to combine the charge packets from adjacent large and small photoelements when operating in the 200 pixel per inch mode.

Figure 4:
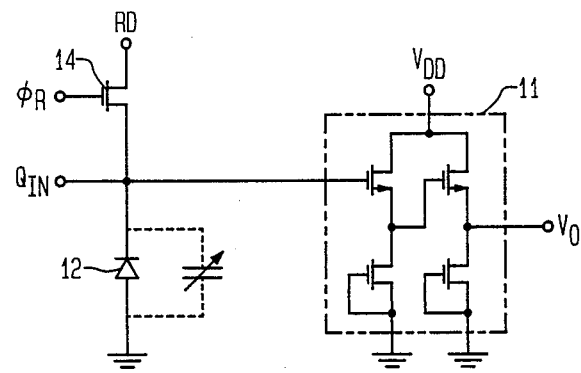
FIG. 4 is an electrical circuit diagram showing the operation of the gain programmable amplifier of FIG. 2.

Referring now to FIG. 4, the charge packets from the pairing enable gate 8' are supplied to the terminal $Q_{in}$ which acts as an input terminal to a cascaded amplifier 11. A PN junction diode 12 connected to the input terminal has an inherent capacitance which is represented in phantom by the capacitor connected in parallel with the diode 12 in FIG. 4. By varying the capacitance of the diode 12, the effective charge-to-voltage conversion factor of the cascaded amplifier 11 can be adjusted. With the capacitance at a high level, the conversion factor is at a minimum, and with the capacitance at a low level, the conversion factor is at a maximum. The capacitance can be switched to four discrete levels between a minimum and a maximum in order to provide the amplifier with the capability of normalizing between modes, as discussed earlier.

In operation, the capacitance of the diode 12 is precharged with the potential supplied to the terminal RD. A reset transistor 14 is driven by a reset clock signal $\phi_R$ to recharge the diode before the arrival of each new signal charge packet from the pairing enable gate 8'. Charge packets from the pairing enable gate 8' change the potential of the precharged diode 12 in response to the quantity of the signal charge delivered. This potential is then sensed by the cascaded amplifier 11 to provide a voltage signal at the output terminal. This output is sent to a comparator circuit for a black/white decision.

Figure 5:
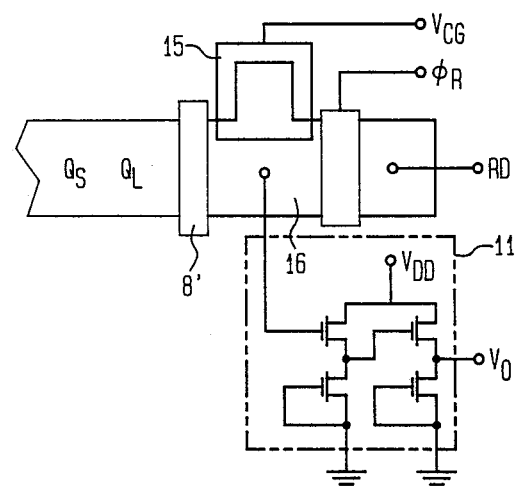
FIG. 5 is a diagram schematically illustrating an integrated circuit embodiment of the gain programmable amplifier.

FIG. 5 shows one way in which the circuit of FIG. 4 can be integrated on the sensor chip. A gate 15 is provided over a gate-controlled channel region 16. The channel region acts as a gate-controlled diode wherein the charge detector diode capacitance may be adjusted by varying the control gate potential $V_{CG}$.

Figure 6:
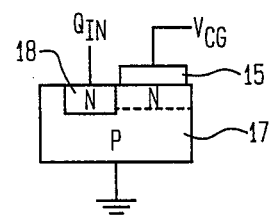
FIG. 6 is a diagram generally illustrating the variable capacitance diode of FIG. 5.

The operation of the gate-controlled diode will be described in more detail with reference to FIG. 6. As shown, a P-doped substrate 17 is provided with an N-doped region 18 to form a PN junction diode. The control gate 15 is arranged over a portion of the P-doped substrate 17. A low voltage on the control gate 15 decreases the effective width of the N-doped region 18, thereby reducing the diode capacitance. Conversely, a high voltage on the control gate 15 increases the effective width of the N-doped region 18 to increase the effective diode capacitance.

The voltage on the control gate 15 can be varied along a continuum between a maximum level and a minimum level. By properly choosing four discrete levels for the control gate voltage, the programmable amplifier 9' can be set to properly normalize the outputs of the sensor at the different spatial sampling frequencies.

In summation, a variable resolution line scan image sensor is provided by a line scanning array which has individual sampling photoelements having at least two different respective sampling areas. By selectively combining the signals generated by the individual photoelements, the spatial sampling frequency of the device can be varied. Although a 4:3 ratio between different modes has been specifically disclosed, different ratios between different modes can be readily obtained by setting the ratio between photoelement sizes to an appropriate value.

Figure 7:
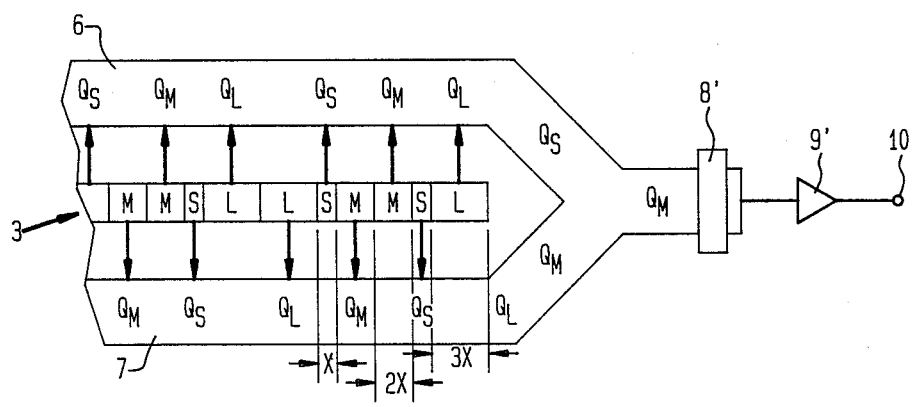
FIG. 7 is a functional block diagram illustrating a second embodiment of a line scan image sensor according to the present invention.

Other variations of this scheme are also possible. For example, FIG. 7 shows another embodiment of a line scan image sensor which could be used to provide a selectable resolution. This embodiment works on the same basic principle of combining the charge packets from different sized photoelements in a predetermined manner to provide a selectable spatial sampling frequency.

As shown, the linear array 3 includes three different sizes of photoelements. Small photoelements S are located between pairs of adjacent large photoelements L and pairs of adjacent medium photoelements M to form the linear array 3. If the small photoelements S have a width X, then the medium photoelements M are provided with a width 2X, and the large photoelements L are given a width of 3X. The charge packets generated by the photoelements are transported by the CCD registers 6 and 7 to the pairing enable gate 8'.

In the 400 pixel per inch mode, the charge packets from the large photoelements L are processed individually and the charge packets from adjacent medium photoelements M and small photoelements S are combined. Since the width of the field of view of the combined photoelements is equal to the width of the field of view of the large photoelements, the amplifier 9' can provide each charge packet with the same conversion factor.

When operating in the 300 pixel per inch mode, the charge packets from adjacent small photoelements S and large photoelements L are combined, as are the charge packets from adjacent medium photoelements M. Again, the surface area of the different combinations are the same and the amplifier 9' only needs to normalize between modes. Thus, if the conversion factor in the 400 pixel per inch mode is $G_4$, then the conversion factor in the 300 pixel per inch mode is 0.75 $G_4$ since the size of each pixel in the 400 pixel per inch mode is 75% of the 300 pixel per inch mode pixel size.

The 200 pixel per inch mode is accomplished by combining the charge packets from a small photoelement S, a medium photoelement M, and a large photoelement L at the pairing enable gate 8'. The amplifier 9' then provides a conversion factor of 0.5 $G_4$ since the pixel size in the 200 pixel per inch mode is twice the pixel size in the 400 pixel per inch mode.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A selectable-resolution solid state image sensor comprising:
   a row of photoelements, each photoelement having a surface area exposed to incident light and producing an electrical signal related in magnitude to said incident light intensity and the surface area of the individual photoelements, said row including first photoelements having a first size aperture and second photoelements having a second size aperture different than said first aperture;
   means for transporting the electrical signals from the photoelements in response to a clock signal; and
   means connected to said transporting means for selectively combining the electrical signals from groups of adjacent photoelements.

2. The solid state image sensor of claim 1, wherein said first size aperture is related to said second size aperture by a ratio of $1:\sqrt{2}$.

3. The solid state image sensor of claim 2, further including programmable amplifier means for selectively amplifying the electrical signals from said photoelements by a factor related to the size of the aperture of the photoelements.

4. The solid state image sensor of claim 1, wherein said transporting means includes first and second rows of charge coupled devices disposed on each side of the row of photoelements.

5. The solid state image sensor of claim 1, further including programmable amplifying means for selectively amplifying the electrical signals from said photoelements by a factor related to the size of the aperture of the photoelements.

6. The solid state image sensor of claim 1, wherein said transporting means includes a pair of charge coupled device serial shift registers and wherein the charge coupled device shift registers and the photoelements are formed on a common substrate.

7. The solid state image sensor of claim 6, further including means connected to said charge coupled device serial shift registers for selectively combining the electrical signals from groups of adjacent photoelements.

8. The solid state image sensor of claim 7, further including programmable amplifying means for selectively amplifying the electrical signals from said photoelements by a factor related to the size of the aperture of the photoelements.

9. A selectable resolution image sensor comprising:
   a row of image sensing elements each producing an electrical signal related to light intensity incident on an exposed surface thereof, the sensing elements including elements of a first exposed surface area and elements of a second exposed surface area different from said first exposed surface area;
   means for selectively combining the electrical signals from groups of said sensing elements; and,
   means for selectively amplifying the combined electrical signals from said combining means by a factor related to the surface areas of the groups of sensing elements represented by the combined signals.

10. The selectable resolution image sensor of claim 9, wherein the first exposed surface area is related to the second exposed surface area by a ratio of $1:\sqrt{2}$.

11. The selectable resolution image sensor of claim 9, wherein said selective combining means includes gating means for selectively combining pairs of electrical signals from the sensing elements in response to a selection of a particular resolution of said image sensor.

12. The selectable resolution image sensor of claim 9, wherein said selective combining means includes gating means for combining predetermined pairs of electrical signals from said sensing elements and for passing uncombined the electrical signals from other predetermined individual sensing elements.

13. A selectable resolution image sensor comprising:
a row of image sensing elements each producing an electrical signal related to light intensity incident on an exposed surface thereof, the sensing elements including elements of a first surface area and elements of a second surface area different from said first surface area;
means for transporting the electrical signals from the image sensing elements; and
means connected to said transporting means for selectively combining the electrical signals from said image sensing elements.

14. The image sensor of claim 13, wherein said selective combining means includes gating means for selectively combining pairs of electrical signals from the sensing elements in response to a selection of a particular resolution of said image sensor.

15. The image sensor of claim 13, wherein said selective combining means includes gating means for combining predetermined pairs of electrical signals from said sensing elements and for passing uncombined the electrical signals from other predetermined individual sensing elements.

16. The image sensor of claim 13, wherein the first surface area is related to the second surface area by a ratio of $1:\sqrt{2}$.

17. The image sensor of claim 16, wherein said selective combining means includes gating means for selectively combining pairs of electrical signals from the sensing elements in response to a selection of a particular resolution of said image sensor.

18. The image sensor of claim 16, wherein said selective combining means includes gating means for combining predetermined pairs of electrical signals from said sensing elements and for passing uncombined the electrical signals from other predetermined individual sensing elements.

19. A selectable resolution image sensor comprising:
a row of contiguous sensing elements each producing an electrical signal related to light intensity incident on an exposed surface thereof, the sensing elements including a first plurality of elements having a width W and a second plurality of elements having a width different than W;
means for transporting the electrical signals from the image sensing elements; and
means connected to said transporting means for selectively combining the electrical signals from said image sensing elements.

20. The image sensor of claim 19, wherein said selective combining means includes gating means for selectively combining pairs of electrical signals from the sensing elements in response to a selection of a particular resolution of said image sensor.

21. The image sensor of claim 19, wherein said selective combining means includes gating means for combining predetermined pairs of electrical signals from said sensing elements and for passing uncombined the electrical signals from other predetermined individual sensing elements.

22. The image sensor of claim 19, wherein said width different than W is $W\sqrt{2}$.

23. The image sensor of claim 22, wherein said selective combining means includes gating means for selectively combining pairs of electrical signals from the sensing elements in response to a selection of a particular resolution of said image sensor.

24. The image sensor of claim 22, wherein said selective combining means includes gating means for combining predetermined pairs of electrical signals from said sensing elements and for passing uncombined the electrical signals from other predetermined individual sensing elements.

* * * * *